United States Patent
Lin

(10) Patent No.: US 11,210,005 B2
(45) Date of Patent: Dec. 28, 2021

(54) UNBALANCED PLANE MANAGEMENT METHOD, ASSOCIATED DATA STORAGE DEVICE AND CONTROLLER THEREOF

(71) Applicant: Silicon Motion, Inc., Hsinchu County (TW)

(72) Inventor: Han-Hung Lin, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/789,355

(22) Filed: Feb. 12, 2020

(65) Prior Publication Data

US 2020/0285393 A1    Sep. 10, 2020

Related U.S. Application Data

(60) Provisional application No. 62/813,169, filed on Mar. 4, 2019.

(30) Foreign Application Priority Data

Aug. 22, 2019    (TW) ................................ 108129939

(51) Int. Cl.
   *G06F 3/06*    (2006.01)
   *G06F 12/02*   (2006.01)
   (Continued)

(52) U.S. Cl.
   CPC ............ *G06F 3/064* (2013.01); *G06F 3/0604* (2013.01); *G06F 3/0679* (2013.01); *G06F 3/061* (2013.01);
   (Continued)

(58) Field of Classification Search
   CPC ...... G06F 3/064; G06F 3/0679; G06F 3/0604; G06F 12/0246; G06F 2212/7208;
   (Continued)

(56) References Cited

U.S. PATENT DOCUMENTS

2012/0191897 A1    7/2012  Yang
2015/0043277 A1    2/2015  Fitzpatrick
(Continued)

FOREIGN PATENT DOCUMENTS

| TW | 200847162 | 12/2008 |
| TW | I650763 B | 2/2019 |
| TW | I652679 B | 3/2019 |

*Primary Examiner* — Masud K Khan
*Assistant Examiner* — Trung-Hao Joseph Nguyen
(74) *Attorney, Agent, or Firm* — Winston Hsu

(57) ABSTRACT

An unbalanced plane management method, an associated data storage device and the controller thereof are provided. The unbalanced plane management method may include: setting an unbalanced plane number; selecting at least one plane with a plane count calculated by subtracting the unbalanced plane number from a maximum plane number, and recording at least one set of blocks of the at least one plane to a block skip table; according to block numbers as indexes, combining blocks of unselected planes into superblocks, wherein said superblocks respectively correspond to said block numbers; and recording total capacity of all superblocks and the unbalanced plane number, to generate a latest record of records of multiple types of storage capacity, for further setting storage capacity configuration of the data storage device, wherein said all superblocks include said superblocks.

15 Claims, 6 Drawing Sheets

(51) Int. Cl.
*G06F 12/06* (2006.01)
*G11C 16/02* (2006.01)

(52) U.S. Cl.
CPC .......... *G06F 3/0631* (2013.01); *G06F 3/0688* (2013.01); *G06F 12/0246* (2013.01); *G06F 12/0292* (2013.01); *G06F 12/0623* (2013.01); *G06F 2212/1016* (2013.01); *G06F 2212/7204* (2013.01); *G06F 2212/7208* (2013.01); *G11C 16/02* (2013.01)

(58) Field of Classification Search
CPC ..... G06F 2212/7204; G06F 2212/1016; G06F 3/0631; G06F 3/0688; G06F 3/061; G06F 12/0292; G06F 12/0623; G11C 16/02
See application file for complete search history.

(56) References Cited

U.S. PATENT DOCUMENTS

| | | | |
|---|---|---|---|
| 2017/0352423 | A1 | 12/2017 | Zhao |
| 2018/0151251 | A1* | 5/2018 | Oh .................. G11C 29/76 |
| 2018/0366210 | A1 | 12/2018 | Park |
| 2019/0205043 | A1* | 7/2019 | Huang ............ G06F 12/1009 |
| 2020/0133492 | A1* | 4/2020 | Bernat ............. G06F 3/0688 |

* cited by examiner

BLOCKSKIPIDX

Block skip index

| 2-0 |
|-----|
| 2-1 |
| .... |
| 2-149 |

ORPHAN_BLOCK_TABLE

Orphan block table

| BLK# | Plane#0 | Plane#1 | Plane#2 | Plane#3 | Plane#4 | Plane#5 | Plane#6 | Plane#7 |
|------|---------|---------|---------|---------|---------|---------|---------|---------|
| 0 | 0-0 | 1-0 | 2-0 | 3-0 | 4-0 | 5-0 | 6-0 | 7-0 |
| 1 | 0-1 | 1-1 | 2-1 | 3-1 | 4-1 | 5-1 | 6-1 | 7-1 |
| .... | .... | .... | .... | .... | .... | .... | .... | .... |
| 149 | 0-149 | 1-149 | 3-149 | 3-149 | 4-149 | 5-149 | 6-149 | 7-149 |
| 150 | 0-150 | 1-150 | 3-150 | 3-150 | 4-150 | 5-150 | 6-150 | 7-150 |
| 151 | 0-151 | 1-151 | 3-151 | 3-151 | 4-151 | 5-151 | 6-151 | 7-151 |
| 152 | 0-152 | 1-152 | 3-152 | 3-152 | 4-152 | 5-152 | 6-152 | 7-152 |
| .... | .... | .... | .... | .... | .... | .... | .... | .... |
| 198 | 0-198 | 1-198 | 3-198 | 3-198 | 4-198 | 5-198 | 6-198 | 7-198 |
| 199 | 0-199 | 1-199 | 3-199 | 3-199 | 4-199 | 5-199 | 6-199 | 7-199 |

FIG. 3

| Die#0 | | | | |
|---|---|---|---|---|
| Block index | Plane#0 | Plane#1 | Plane#2 | Plane#3 |
| | 0-0 | 1-0 | 2-0 | 3-0 |
| | 0-1 | 1-1 | 2-1 | 3-1 |
| | ... | ... | ... | ... |
| | 0-149 | 1-149 | 2-149 | 3-149 |
| | 0-150 | 1-150 | X | 3-150 |
| | ... | ... | ... | ... |
| | 0-179 | 1-179 | X | 3-179 |
| | 0-180 | 1-180 | X | 3-180 |
| | ... | ... | ... | ... |
| | 0-198 | 1-198 | X | 3-198 |
| | 0-199 | 1-199 | X | 3-199 |

| Die#1 | | | | |
|---|---|---|---|---|
| Block index | Plane#0 | Plane#1 | Plane#2 | Plane#3 |
| | 0-0 | 1-0 | 2-0 | 3-0 |
| | 0-1 | 1-1 | 2-1 | 3-1 |
| | ... | ... | ... | ... |
| | 0-149 | 1-149 | 2-149 | 3-149 |
| | 0-150 | 1-150 | 2-150 | 3-150 |
| | ... | ... | ... | ... |
| | 0-179 | 1-179 | 2-179 | 3-179 |
| | 0-180 | 1-180 | X | 3-180 |
| | ... | ... | ... | ... |
| | 0-198 | 1-198 | X | 3-198 |
| | 0-199 | 1-199 | X | 3-199 |

FIG. 4

BLOCKSKIPIDX

Block skip index

| |
|---|
| 2-0 |
| 2-1 |
| ..... |
| 2-149 |

ORPHAN_BLOCK_TABLE

Orphan block table

| BLK# | Plane#0 | Plane#1 | Plane#2 | Plane#3 | Plane#4 | Plane#5 | Plane#6 | Plane#7 |
|---|---|---|---|---|---|---|---|---|
| 0 | 0-0 | 1-0 | | 3-0 | 4-0 | 5-0 | 6-0 | 7-0 |
| 1 | 0-1 | 1-1 | | 3-1 | 4-1 | 5-1 | 6-1 | 7-1 |
| ..... | | | | | | | | |
| 149 | 0-149 | 1-149 | | 3-149 | 4-149 | 5-149 | 6-149 | 7-149 |
| 150 | 0-150 | 1-150 | | 3-150 | 4-150 | 5-150 | 6-150 | 7-150 |
| ..... | | | | | | | | |
| 179 | 0-179 | 1-179 | | 3-179 | 4-179 | 5-179 | 6-179 | 7-179 |
| 180 | 0-180 | 1-180 | 2-0 | 3-180 | 4-180 | 5-180 | 6-180 | 7-180 |
| 181 | 0-181 | 1-181 | 2-1 | 3-181 | 4-181 | 5-181 | 6-181 | 7-181 |
| 182 | 0-182 | 1-182 | 2-2 | 3-182 | 4-182 | 5-182 | 6-182 | 7-182 |
| ..... | | | | | | | | |
| 198 | 0-198 | 1-198 | 2-18 | 3-198 | 4-198 | 5-198 | 6-198 | 7-198 |
| 199 | 0-199 | 1-199 | 2-19 | 3-199 | 4-199 | 5-199 | 6-199 | 7-199 |

FIG. 5

UNBALANCED PLANE MANAGEMENT METHOD, ASSOCIATED DATA STORAGE DEVICE AND CONTROLLER THEREOF

CROSS REFERENCE TO RELATED APPLICATIONS

This application claims the benefit of U.S. provisional application of U.S. 62/813,169, which was filed on Mar. 4, 2019, and is included herein by reference.

BACKGROUND OF THE INVENTION

1. Field of the Invention

The present invention relates to accessing of a flash memory, and more particularly, to an unbalanced plane management method, data storage device and controller thereof.

2. Description of the Prior Art

Developments in flash memory technology have led to the wide application of portable or non-portable data storage devices. Examples thereof include memory cards conforming to SD/MMC, CF, MS, XD or UFS specifications, solid-state drives, and embedded storage devices conforming to UFS or EMMC specifications. NAND flash memories may comprise single level cell (SLC) and multiple level cell (MLC) flash memories. New data storage device products may utilize triple level cell (TLC) flash memories, or even quadruple level cell (QLC) flash memories. To ensure the access control of a flash memory in a data storage device meets related specifications, a controller of the flash memory is usually arranged to have some management mechanisms to properly manage internal operations thereof.

According to related art techniques, even a memory device with any of the above management mechanisms is still not good enough. For example, multiple flash memory dies may be simultaneously used to raise the access efficiency. However, the number of normally-functioning blocks in certain flash memory dies might limit the usage rate of each block of these flash dies. For example, under the situation where the number of these normally-functioning blocks is relatively small or the distribution of these normally-functioning blocks is not balanced enough, a desired storage capacity can hardly be achieved. Hence, there is a need for a novel method and associated architecture to achieve a data storage device with a reliable management mechanism, without introducing a side effect or in a way less likely to introduce a side effect.

SUMMARY OF THE INVENTION

An objective of the present invention is to provide an unbalanced plane management method and associated data storage device and the controller thereof, to solve the aforementioned problem.

An objective of the present invention is to provide an unbalanced plane management method and associated data storage device and the controller thereof, in order to provide the data storage device with a reliable management mechanism.

At least one embodiment of the present invention provides an unbalanced plane management method applicable to a data storage device. The data storage device comprises a non-volatile (NV) memory, the NV memory comprises a plurality of NV memory elements, and the plurality of NV memory elements comprises a plurality of blocks. The unbalanced plane management method comprises: setting an unbalanced plane number, wherein the unbalanced plane number is less than a maximum plane number, and the maximum plane number represents a summation of numbers of respective planes of the plurality of NV memory elements; selecting at least one plane with a plane count calculated by subtracting the unbalanced plane number from the maximum plane number, and recording at least one set of blocks of the at least one plane into a block skip table; combining blocks of unselected planes into superblocks according to block numbers as indexes, wherein said superblocks correspond to said block numbers respectively; and recording a total capacity of all superblocks and the unbalanced plane number to generate a latest record of records of multiple types of storage capacity, for further setting storage capacity configuration of the data storage device, wherein said all superblocks comprise said superblocks.

At least one embodiment of the present invention provides a data storage device that comprises an NV memory and a controller. The NV memory is arranged to store information, wherein the NV memory comprises a plurality of NV memory elements, and the plurality of NV memory elements comprises a plurality of blocks. The controller is coupled to the NV memory, and arranged to control operations of the data storage device. The controller comprises a processing circuit that is arranged to control the controller according to a plurality of host commands from a host device, to allow the host device to access the NV memory via the controller. The controller sets an unbalanced plane number, wherein the unbalanced plane number is less than a maximum plane number representing a summation of numbers of respective planes of the plurality of NV memory elements. The controller selects at least one plane with a plane count calculated by subtracting the unbalanced plane number from the maximum plane number, and records at least one set of block of the at least one plane to a block skip table. According to block numbers as indexes, the controller combines blocks of unselected planes into superblocks, wherein said superblocks are corresponding to said block numbers respectively. The controller records the total capacity of all superblocks and the unbalanced plane number to generate a latest record of records of multiple types of storage capacity, for further setting storage capacity configuration of the data storage device, wherein said all superblocks comprise said superblocks.

At least one embodiment of the present invention provides a controller of a data storage device. The data storage device comprises the controller and an NV memory. The NV memory comprises a plurality of NV memory elements, and the plurality of NV memory elements comprises a plurality of blocks. The controller comprises a processing circuit which is arranged to control the controller according to a plurality of host commands from a host device, to allow the host device to access the NV memory via the controller. The controller sets an unbalanced plane number, wherein the unbalanced plane number is less than a maximum plane number, and the maximum plane number represents a summation of numbers of respective planes of the plurality of NV memory elements. The controller selects at least one plane with a plane count calculated by subtracting the unbalanced plane number from the maximum plane number, and records at least one set of block of the at least one plane to a block skip table. According to block numbers as indexes, the controller combines blocks of unselected planes into superblocks, wherein said superblocks are corresponding to said block numbers respectively. The controller records a total capacity of all superblocks and the unbalanced plane number, to generate a latest record of records of multiple types of storage capacity, for further setting storage capacity configuration of the data storage device, wherein said all superblocks comprise said superblocks.

An advantage provided by the present invention is that, with the carefully designed management mechanism, the present invention is able to perform proper control on operations of the controller, and more particularly, is able to allow the data storage device to use an unbalanced plane to perform operations, e.g. using the planes with modifiable number of superblocks rather than using all planes. Hence, the present invention may break through the limit of the number of normally-functioning blocks of NAND flash memories and integrate for the largest storage capacity, or may otherwise efficiently integrate sufficient numbers of superblocks under demand for a specific storage capacity, to reach the optimal efficiency. Further, the implementation of the embodiments of the present invention does not increase additional cost significantly. Hence, the problems encountered in related art techniques can be properly solved without increasing the overall cost significantly. Compared with related art techniques, the present invention may achieve the optimal technique of a memory device without introducing a side effect or in away less likely to introduce a side effect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a superblock management scheme according to an embodiment of the present invention.

FIG. 4 illustrates an example of the distribution of bad blocks.

FIG. 5 illustrates a superblock management scheme according to another embodiment of the present invention.

DETAILED DESCRIPTION

Figure 1:
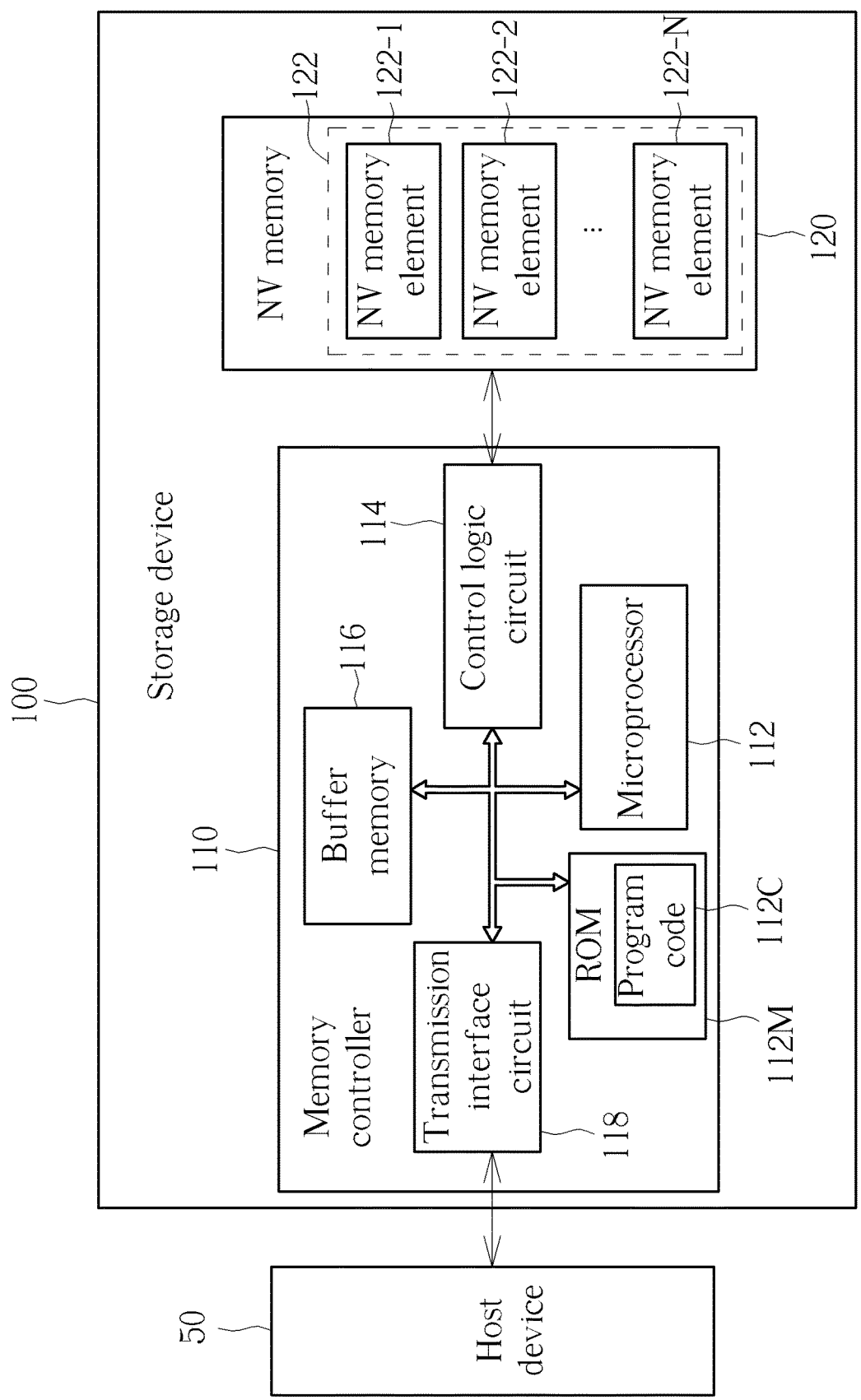
FIG. 1 is a diagram illustrating a data storage device and a host device according to a first embodiment of the present invention.

Please refer to FIG. 1, which is a diagram illustrating a data storage device 100 and a host device 50 according to a first embodiment of the present invention. For example, the data storage device 100 may be a solid state drive (SSD). Further, example s of the host device 50 may comprise (but are not limited to): multifunctional mobile phones, tablets and personal computers (such as desktop and laptop computers). According to this embodiment, the data storage device 100 may comprise a controller such as the memory controller 110, and may further comprise a non-volatile (NV) memory 120, wherein the controller is arranged to access the NV memory 120, and the NV memory 120 is arranged to store information.

The NV memory 120 may comprise a plurality of NV memory elements 122-1, 122-2, . . . and 122-N, wherein the symbol "N" may represent an integer greater than 1. For example: the NV memory 120 may be a flash memory, and the NV memory elements 122-1, 122-2, . . . and 122-N may respectively be a plurality of flash memory chips or a plurality of flash memory dies, but the present invention is not limited thereto. In addition, the data storage device 100 may further comprise volatile memory elements for buffering data, wherein the volatile memory elements may preferably be dynamic random access memories (DRAMs). The aforementioned volatile memory elements may provide a suitable temporary storage space for buffering data, or merely provide a small amount of temporary storage space to buffer a small amount of data. This kind of architecture is also called "partial DRAM". Further, the volatile memory element may be optional.

The memory controller 110 may comprise a processing circuit (such as a microprocessor 112), a storage (such as a read only memory (ROM) 112M), a control logic circuit 114, a buffer memory 116 and a transmission interface circuit 118, wherein these elements may be coupled to each other via a bus. The buffer memory 116 is preferably a static random access memory (SRAM). For example, if the data storage device 100 is further configured with the aforementioned DRAM, the memory controller 110 may utilize the buffer memory 116 (such as SRAM) as a first layer cache, and utilize the DRAM as a second layer cache. The storage capacity of the DRAM is preferably larger than that of the buffer memory 116, and the data processed by the buffer memory 116 may originate from the DRAM or the NV memory 120.

The ROM 112M in this embodiment is arranged to store a program code 112C, and the microprocessor 112 is arranged to execute the program code 112C to control the access of the NV memory 120. Please note that the program code 112C may also be stored in the buffer memory 116 or any types of memories. In addition, the control logic circuit 114 may comprise at least one error correction code (ECC) circuit (not shown) to protect data and/or perform error corrections. The transmission interface circuit 118 may conform to a specific communications specification, such as the Serial Advanced Technology Attachment (SATA) specification, Peripheral Component Interconnect Express (PCIE) specification or Non-Volatile Memory Express (NVME) specification, and may perform communications with the host device 50 according to the specific communications specification.

In this embodiment, the host device 50 may transmit a plurality of host commands to the data storage device 100, the memory controller 110 may further access (e.g. read or write) the NV memory 120 according to host command, wherein the aforementioned data preferably originates from the user data of the host device 50. The host command comprises a logical address, e.g. a logical block address (LBA). The memory controller 110 may receive host commands and translate them into memory operation commands respectively, and may further use the operation commands to control the NV memory 120 to read and write/program pages of specific physical addresses in the NV memory 120.

The memory controller 110 records the mapping relationship between logical addresses and physical addresses of data in the Logical-to-Physical (L2P) address mapping table, wherein the physical address may be formed by: the channel number, logic unit number (LUN), plane number, block number, page number and the offset. In some embodiments, the implementation of the physical addresses may be modified. For example, a physical address may comprise the channel number, logic unit number, plane number, block number, page number and/or the offset.

The L2P mapping table may be stored in a system block of the NV memory 120, and may be divided into multiple group-mapping tables, wherein each of the multiple group-mapping tables records a mapping relationship of a segment of logical addresses. The system block is preferably an encrypted block where data is programmed in the SLC mode. The memory controller 110 may load part of all group-mapping tables of the multiple group-mapping table to the buffer memory 116 from the NV memory 120 according to the capacity of the buffer memory 116 as a timely reference, but the present invention is not limited thereto, however. When the user data is updated, the memory controller 110 may update the content of the group-mapping tables according to the latest mapping relationship of the user data. The size of a group-mapping table is preferably not larger than the size of a page of the NV memory element 122-$n$, such as 16 kilobytes (KB), wherein the symbol "$n$" may represent any integer with [1, N], but the present invention is not limited thereto. In another example, the size of the group-mapping table may be 4 KB or 1 KB.

The NV memory element 122-$n$ may comprise multiple planes, such as the planes #0, #1, #2and #3 each comprising multiple blocks, and each of the blocks comprises multiple pages. In this case, the memory controller 110 may combine four blocks respectively belonging to the plans #0-#3 into a large block, where the size of the large block is equal to that of four blocks (i.e. four times the size of a block).

The memory controller 110 may combine two large blocks respectively belonging to the two NV memory elements 122-$n$ in the channels CH #0 and CH #1 into a superblock, SB), wherein the size of the superblock is equal to eight times a block. These two NV memory elements 122-$n$ may be controlled by the same chip enable (CE) signal, but the present invention is not limited thereto. For example, if the channel number is set as 4 (such as the channels CH #0-CH #3), four large blocks respectively belonging to NV memory elements of the channels CH #0-CH #3 may also form a superblock which may be controlled by a chip enable signal.

Figure 2:
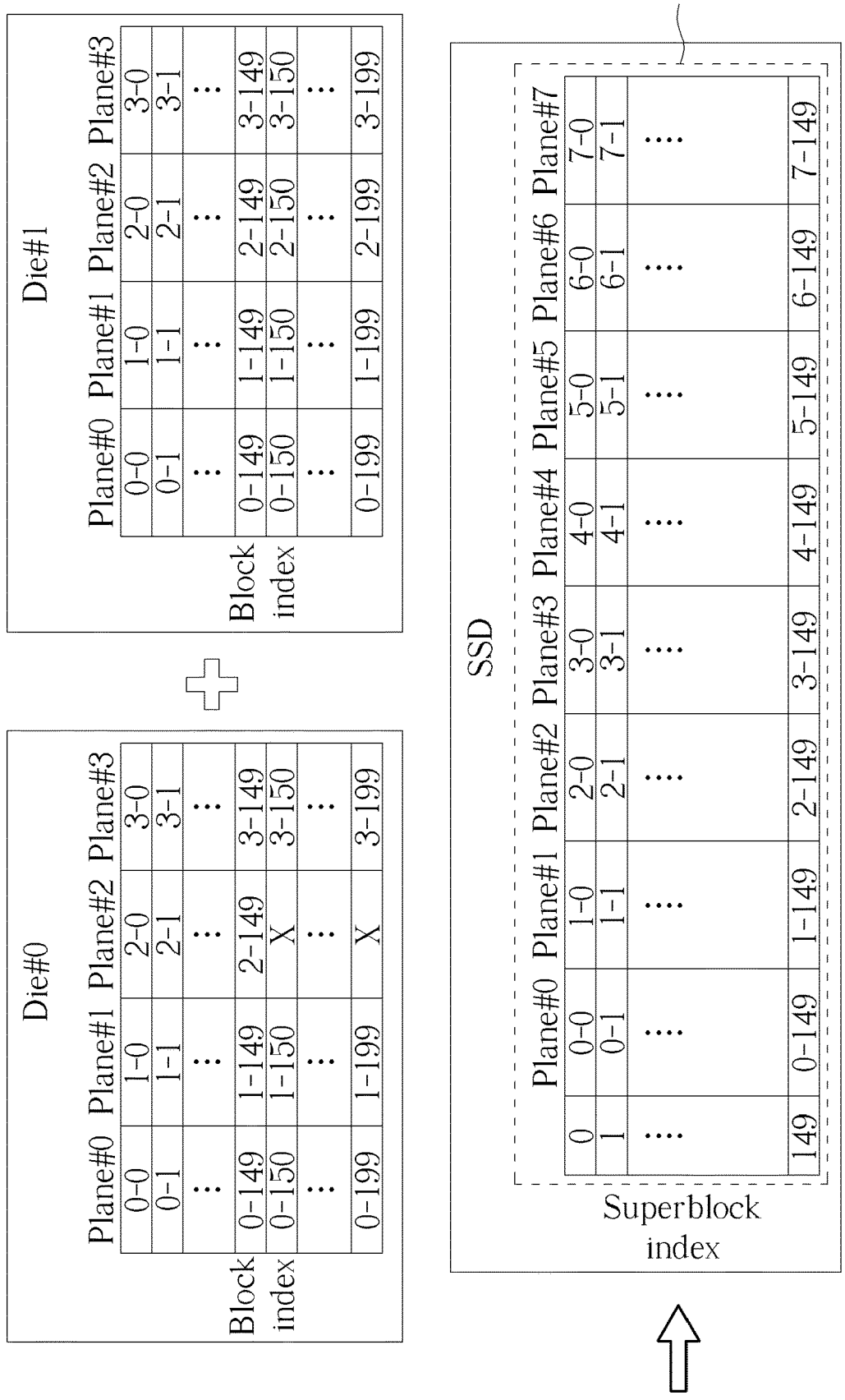
FIG. 2 is a diagram illustrating a management scheme for dealing with superblocks.

FIG. 2 is a diagram illustrating a management scheme for dealing with superblocks. The NV memory elements 122-1, 122-2, . . . and 122-N may be implemented as a plurality of flash memory dies, such as the dies #0 and #1, wherein the dies #0 and #1 may be used as two NV memory elements 122-$n$ respectively in each of the aforementioned channels CH #0 and CH #1, and this architecture is an example for illustrating the formation of superblocks as follows. The die #0 may comprise 4 planes, and thus the blocks in the die #0 may be presented by 4 sets of block indexes, such as the block indexes {0-0, 0-1, . . . , 0-199}, {1-0, 1-1, . . . , 1-199}, {2-0, 2-1, . . . , 2-199} and {3-0, 3-1, . . . , 3-199} thereof. Similarly, the die #1 may also comprise 4 planes, and thus the blocks in the die #1 may also be presented by 4 sets of block indexes, such as the block indexes {0-0, 0-1, . . . , 0-199}, {1-0, 1-1, . . . , 1-199}, {2-0, 2-1, . . . , 2-199} and {3-0, 3-1, . . . , 3-199} thereof.

When forming a superblock, the dies #0-#1 may be placed in the channels CH #0 and CH #1 respectively. In this way, the blocks in the superblock may be presented by block indexes, such as 8 set of block indexes containing the block index format [Die #, PLN #, BLK #], i.e. {[0, 0, 0], [0, 0, 1], . . . , [0, 0, 199]}, {[0, 1, 0], [0, 1, 1], . . . , [0, 1, 199]}, {[0, 2, 0], [0, 2, 1], . . . , [0, 2, 149]}, {[0, 3, 0], [0, 3, 1], . . . , [0, 3, 199]}, {[1, 4, 0], [1, 4, 1], . . . , [1, 4, 199]}, {[1, 5, 0], [1, 5, 1], . . . , [1, 5, 199]}, {[1, 6, 0], [1, 6, 1], . . . , [1, 6, 199]} and {[1, 7, 0], [1, 7, 1], . . . , [1, 7, 199]}. "Die #, PLN #and BLK #" within the block index format [Die #, PLN #, BLK #] represent the die number, plane number and block number respectively, wherein the die number and the plane number are preferably progressive values (e.g. a series of values with a fixed increment), and the die number can sometimes be replaced by the channel number. Further, in the aforementioned architecture, since the blocks in the superblock originate from eight planes, this kind of superblock may be also called eight-plane superblock or a balanced plane architecture.

In an ideal condition, assuming that the respective planes #0-#3 of the dies #0 and #1 may comprise the same amount of normally-functioning blocks (i.e. Good blocks) without a single bad block, e.g. all 200 blocks #0-#199 are normally-functioning blocks, the memory controller 110 may combine blocks in same block number within the planes #0-#3 of the dies #0 and #1 into a superblock, and may accordingly form 200 superblocks in total. Since all blocks are normally-functioning blocks, the memory controller 110 can form a largest superblock which contain most blocks. Therefore, the data storage device 100 (e.g. SSD) may provide an ideal storage capacity. Assuming that the storage capacity of each die is 64 GB (Gigabytes), the data storage device 100 may provide a 128 GB storage capacity. Since blocks in a die are combined into a superblock, the data storage device 100 may provide an ideal, or even better access efficiency.

In reality, however, a die usually comprises a portion of bad blocks. For example, the blocks #150-#199 of the plane #2 of the die #0 are all bad blocks, as those marked with the symbol "X". Hence, in practice, the memory controller 110 may combine blocks with same block number of the planes #0-#3 in the dies #0 and #1 into a superblock, as indicated by the superblock indexes {0, 1, . . . , 149} shown in the lower half of FIG. 2, wherein the block indexes {0-0, 0-1, . . . , 0-149}, {1-0, 1-1, . . . , 1-149}, {2-0, 2-1, . . . , 2-149} and {3-0, 3-1, . . . , 3-149} shown in lower-left corner of FIG. 2 may represent the block indexes {0-0, 0-1, . . . , 0-149}, {1-0, 1-1, . . . , 1-149}, {2-0, 2-1, . . . , 2-149} and {3-0, 3-1, . . . , 3-149} of the die #0, and the block indexes {4-0, 4-1, . . . , 4-149}, {5-0, 5-1, . . . , 5-149}, {6-0, 6-1, . . . , 6-149} and {7-0, 7-1, . . . , 7-149} shown in the lower-right corner of FIG. 2 may represent the block indexes {0-0, 0-1, . . . , 0-149}, {1-0, 1-1, . . . , 1-149}, {2-0, 2-1, . . . , 2-149} and {3-0, 3-1, . . . , 3-149} of the die #1. Under real circumstances, the memory controller 110 may only combines for 150 superblocks, the data storage device 100 may only provide a 96 GB storage capacity (e.g. (128*(150/200))=96). The remaining blocks that are not combined into a superblock (e.g. the blocks #150-#199 of the planes #0, #1 and #3 of the die #0, and the blocks #150-#199 of the planes #0-#3 of the die #1), however, are used for over-provisioning, and thus cannot be used as the storage capacity of the data storage device 100.

In order to overcome the aforementioned problem, the present invention provides an unbalanced plane management method, which may develop a different storage capacity when the data storage device 100 performs storage capacity detections and therefore the capacity threshold (e.g. 100 GB) cannot be achieved, to make the storage capacity of the data storage device 100 possible to exceed the capacity threshold, thereby achieving the goal of the present invention. In addition, the unbalanced plane management method of the present invention is not limited to integrating one block of each plan into a superblock. The unbalanced plane management method may flexibly adjust the formation of superblocks according to actual needs, or may adjust the number of planes to form any superblock when there is a need. For example, when using the unbalanced plane management method of the present invention to manage the dies #0 and #1, a superblock may be formed by blocks of seven planes among eight planes, as shown in FIG. 3, wherein the block indexes {0-0, 0-1, . . . , 0-199}, {1-0, 1-1, . . . , 1-199}, {2-0, 2-1, . . . , 2-149} and {3-0, 3-1, . . . , 3-199} may represent the block indexes {0-0, 0-1, . . . , 0-199}, {1-0, 1-1, . . . , 1-199}, {2-0, 2-1, . . . , 2-149} and {3-0, 3-1, . . . , 3-199} of the die #0, and the block indexes {4-0, 4-1, . . . , 4-199}, {5-0, 5-1, . . . , 5-199}, {6-0, 6-1, . . . , 6-199} and {7-0, 7-1, . . . , 7-199} may represent the block indexes {0-0, 0-1, . . . , 0-199}, {1-0, 1-1, . . . , 1-199}, {2-0, 2-1, . . . , 2-199} and {3-0, 3-1, . . . , 3-199} of the die #1. In this way, more superblocks can be generated (increasing the number of superblocks from 150 to 200) and the storage capacity the data storage device 100 may be increased (e.g. increased from 96 GB to 112 GB, which can be derived from: "128*(7/8))=112"), to successfully achieve the goal of the present invention.

Under another real circumstance, as shown in FIG. 4, the blocks #150-#199 of the plane #2 of the die #0 are all bad blocks, and the blocks #180-#199 of the plane #2 of the die #1 are all bad blocks. Hence, the data storage device 100 can merely provide a 96 GB storage capacity. When adopting an unbalanced plane management method provided by the present invention, a superblock may be formed by blocks from seven planes among eight planes as shown in FIG. 5, wherein the block indexes {0-0, 0-1, . . . , 0-199}, {1-0, 1-1, . . . , 1-199}, {2-0, 2-1, . . . , 2-149} and {3-0, 3-1, . . . , 3-199} may represent the block indexes {0-0, 0-1, . . . , 0-199}, {1-0, 1-1, . . . , 1-199}, {2-0, 2-1, . . . , 2-149} and {3-0, 3-1, . . . , 3-199} of the die #0, and the block indexes {4-0, 4-1, . . . , 4-199}, {5-0, 5-1, . . . , 5-199}, {6-0, 6-1, . . . , 6-179} and {7-0, 7-1, . . . , 7-199} may represent the block indexes {0-0, 0-1, . . . , 0-199}, {1-0, 1-1, . . . , 1-199}, {2-0, 2-1, . . . , 2-179} and {3-0, 3-1, . . . , 3-199} of the die #1. Blocks belonging to the superblocks #0-#179 (which are the majority of blocks) may be formed by the planes #0, #1 and #3 of the die #0 and the blocks #0-#179 of each of the planes #0-#3 of the die #1, and another portion of blocks belonging to the superblocks #180-#199 (which are the minority of blocks) may instead be formed by the blocks #180-#199 of each of the planes #0, #1 and #3 of each of the dies #0 and #1 as well as the blocks #0-#19 of the plane #2 of the die #0 (as shown in the dotted frame). In this way, 200 superblocks can still be provided, so that the storage capacity of the data storage device 100 may be increased from 96 GB to 112 GB, thereby successfully achieve the goal of the present invention.

Figure 6:
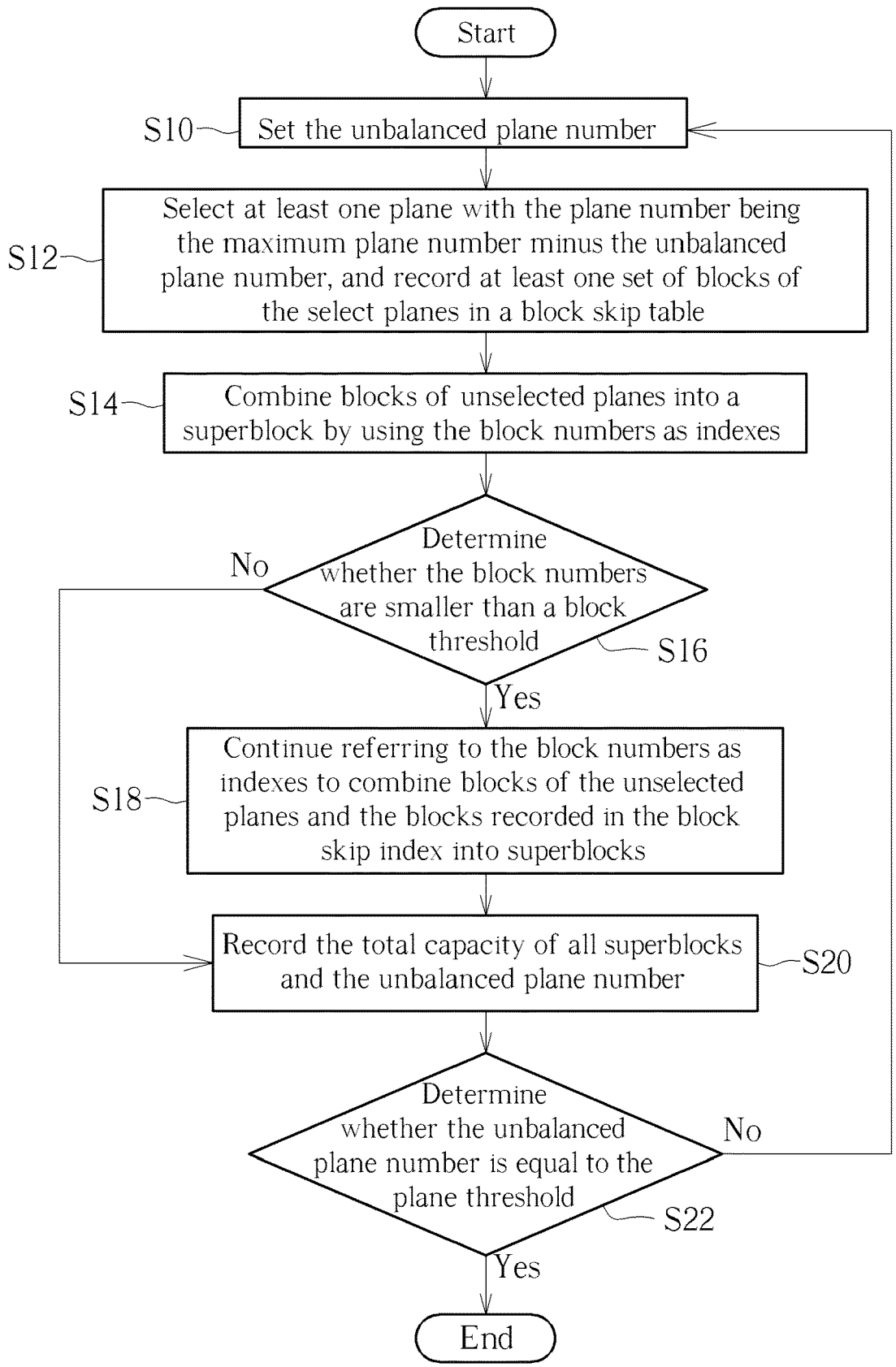
FIG. 6 illustrates a workflow of an unbalanced plane management method according to an embodiment of the present invention.

FIG. 6 illustrates a workflow of an unbalanced plane management method according to an embodiment of the present invention. The unbalanced plane management method of the present invention may be applied to the data storage device 100, and may be executed by the memory controller 110 of the data storage device 100. Further, after executing the unbalanced plane management method of the present invention, the memory controller 110 may generate the records of multiple types of storage capacity, which may respectively correspond to possible values of a plane count parameter such as an unbalanced plane number UNBAL_NUM, and more particularly, correspond to multiple possible values (e.g. multiple candidate values) of the unbalanced plane number UNBAL_NUM, respectively, and the user may select a record corresponding to a certain possible value of the multiple possible values (e.g. a certain candidate value among said multiple candidate values) from the records of the aforementioned multiple types of storage capacity based on his/her actual needs or demands. For example, the user may select a record with the largest storage capacity, or may select a record with the second largest storage capacity value (e.g. largest one among those except the largest storage capacity) but also with a relatively small unbalanced plane number UNBAL_NUM. By selecting the value of the unbalanced plane number UNBAL_NUM that corresponds to the selected record, the data storage device 100 can provide the demanded storage capacity through the corresponding storage capacity configuration.

In Step S10, the memory controller 110 sets the unbalanced plane number UNBAL_NUM, wherein the unbalanced plane number UNBAL_NUM is less than a maximum plane number. The maximum plane number represents the summation of the respective numbers of the respective planes of the plurality of NV memory elements 122-1, 122-2, . . . and 122-N, such as the summation of the respective plane numbers/counts of the NV memory elements 122-1, 122-2, . . . and 122-N. More particularly, the maximum plane number may equal to the die count DIE COUNT multiplied by the plane number PLANE NUM. Taking the aforementioned embodiment as an example, the data storage device 100 is configured with the dies #0 and #1 and the die count DIE COUNT is equal to 2. The plane number PLANE NUM may represent the total number of the planes of each die, wherein the dies #0 and #1 respectively comprise their own planes #0-#3, and the plane number PLANE NUM equals to 4. Hence, the maximum plane number will equal to 8. The initial value of the unbalanced plane number UNBAL_NUM may equal to 7, and the minimum value of the unbalanced plane number UNBAL_NUM may equal to 2.

In Step S12, the memory controller 110 selects at least one plane with the plane number thereof (e.g. the number of the at least one plane currently selected) being the maximum plane number minus the unbalanced plane number UNBAL_NUM, and records at least one set of blocks (e.g. the block indexes thereof) of the select planes (such as the at least one plane) in a block skip table such as at least one set of block skip indexes BLOCKSKIPIDX corresponding to the at least one plane, wherein the block skip table may comprise said at least one set of block skip indexes BLOCKSKIPIDX. Said at least one set of block skip indexes BLOCKSKIPIDX are preferably an array which may comprise one or more sub-arrays, and a sub-array count of said one or more sub-arrays of the array is preferably equal to the maximum plane number minus the unbalanced plane number UNBAL_NUM. In addition, the size of the array is preferably equal to the total number of said at least one set of blocks. Taking the upper half of FIG. 2 and FIG. 4 as examples, the maximum plane number is equal to 8 and the unbalanced plane number UNBAL_NUM is equal to 7, and thus the memory controller 110 will select one plane (e.g. 8-7=1). Since the total number of the normally-functioning blocks in the plane #2 of the die #0 is fewest, the memory controller 110 may select the plane #2 of the die #0, and record the blocks #0-#149 of the plane #2 of the die #0 (e.g. the block indexes thereof) into the block skip index BLOCKSKIPIDX. For example, assuming the unbalanced plane number UNBAL_NUM may be modified, when the unbalanced plane number UNBAL_NUM is equal to 6, since the total amounts of the normally-functioning blocks in the plane #2 of the die #0 and the plane #2 of the die #1 are fewest, the memory controller 110 will select the plane #2 of the die #0 and the plane #2 of the die #1, and record the blocks #0-#149 of the plane #2 of the die #0 and the blocks #0-#179 of the plane #2 of the die #1 (e.g. the block indexes thereof) into the block skip index BLOCKSKIP-IDX. Further, in some embodiments, the memory controller 110 may select one or more planes with the largest total amount of normally-functioning blocks, and record the blocks (or the block indexes thereof) of the one or more planes into the block skip index BLOCKSKIPIDX, but the present invention is not limited thereto.

In Step S14, the memory controller 110 may combine blocks of unselected planes into superblocks according to the block numbers as indexes (e.g. BLK #=0, BLK #=1 . . . ), and more particularly, the memory controller 110 may one by one and/or sequentially combine blocks #0, #1, . . . of these planes into superblocks #0, #1, . . . respectively, wherein these superblocks correspond to these block numbers respectively. Taking the upper half of FIG. 2 and FIG. 4 as an example, the unselected planes may be the planes #0, #1, #3 of the die #0 and the planes #0-#3 of the die #1, and the memory controller 110 may refer to the block numbers as indexes to record blocks of the unselected planes (e.g. the block indexes thereof) into the orphan block table ORPHAN BLOCK TABLE, as shown in FIG. 3 and FIG. 5. The orphan block table ORPHAN BLOCK TABLE records the block numbers of each superblock. For example, the superblock #0 may be formed by blocks #0 by seven different planes, the superblock #1 may be formed by blocks #1 of seven different planes, and so on. The superblocks in such kind of architecture may be also called 7-plane superblocks, or non-balanced plane superblocks.

In Step S16, the memory controller 110 determines whether the block numbers in Step S14 are less than a block threshold in order to generate a determination result. More particularly, the memory controller 110 may compare the last block number within a block number sequence formed by the block numbers with the block threshold in order to generate the determination result, wherein the last block number has the greatest value among the block numbers. If the result suggests "Yes" (e.g. the determination result is "True"), the flow goes to Step S18. Otherwise, If the result suggests "No" (e.g. the determination result is "False"), the flow goes to Step S20.

The block threshold is equal to a predetermine value, and is preferably equal to the greatest block number within all available block numbers {BLK #}. Taking the upper half of FIG. 2 and FIG. 4 as an example, the block threshold is equal to the greatest value within the aforementioned all available block numbers {BLK #}, i.e. 199. Taking FIG. 3 as an example, in response to the change of the block number BLK #, the orphan block table ORPHAN BLOCK TABLE may successfully create the superblock #0 to the superblock #199. Therefore, when the result in Step S16 is determined as "No", it means the detection on the current value of the unbalanced plane number UNBAL_NUM has been completed, and the flow may go on entering Step S20. More particularly, the flow may execute Step S10 according to a specific determination result in Step S22 to achieve the detection on the next value of the unbalanced plane number UNBAL_NUM. For example, the memory controller 110 may set the next value (i.e. the latest value) of the unbalanced plane number UNBAL_NUM in Step S10 as the current value of the unbalanced plane number UNBAL_NUM minus 1.

In Step S18, the memory controller 110 continues referring to the block numbers as indexes. More particularly, by referring to the remaining block numbers within the aforementioned all available block numbers {BLK #} (e.g. the subsequent block numbers of the aforementioned block number in Step S14) as indexes, the memory controller 110 may combine other blocks of the aforementioned unselected planes (e.g. the subsequent blocks corresponding to the aforementioned subsequent block numbers) and the blocks recorded in the block skip index BLOCKSKIPIDX into other superblocks, such as the subsequent superblocks of the aforementioned superblock mentioned in Step S14. Taking FIG. 4 and FIG. 5 as an example, the table content of the orphan block table ORPHAN BLOCK TABLE (e.g. the superblocks represented by the block indexes therein) may be successfully created up to the superblock #179. However, upon creating the superblock #180, since only six planes have the blocks #180, the memory controller 110 may create the superblock #180 by selecting the block #0 of the plane #2 of the die #0 recorded in the block skip index BLOCK-SKIPIDX and the blocks #180 of six different planes. After that, the memory controller 110 may select the block #1 of the plane #2 of the die #0 recorded in the block skip index BLOCKSKIPIDX and the blocks #181 of six different planes to create the superblock #181, and so on, until the creation of the superblock #199 is completed as shown in FIG. 5.

In Step S20, the memory controller 110 records the total capacity of all superblocks and the unbalanced plane number UNBAL_NUM to generate a latest record of records of the aforementioned multiple types of storage capacity, for further setting the storage capacity configuration of the data storage device 100, wherein the aforementioned all superblocks may comprise the superblocks mentioned in Step S14, and more particularly, may further comprise the other superblocks mentioned in Step S18 (if Step S18 is already executed). After the creation of the orphan block table ORPHAN BLOCK TABLE is completed, the memory controller 110 may calculate the total capacity of superblocks according to the orphan block table ORPHAN BLOCK TABLE (e.g. 112 GB), and may record the total capacity of the superblocks and the current value of the unbalanced plane number UNBAL_NUM (e.g. 7).

In Step S22, the memory controller 110 may determine whether the unbalanced plane number UNBAL_NUM is equal to the plane threshold. If the result is "No" (e.g. the determination result suggests "False"), the flow goes to Step S10. Otherwise, if the result is "Yes" (e.g. the determination result suggests "True"), the execution of the unbalanced plane management method will be terminated. In Step S10, the memory controller 110 may set the next value of the unbalanced plane number UNBAL_NUM (e.g. the latest value) as the current value of the unbalanced plane number UNBAL_NUM minus 1. Further, the plane threshold may be equal to the minimum value of the UNBAL_NUM, e.g. 2.

As can be seen from the above, the unbalanced plane management method provided by at least one embodiment of the present invention may successfully increase the storage capacity of the data storage device 100 from 96 GB to 112 GB and make the data storage device 100 have high access efficiency based on superblocks, while the remaining unused blocks (e.g. the blocks recorded in the block skip index BLOCKSKIPIDX) may be reserved for over-provisioning purposes. The above approaches help reach the goal of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An unbalanced plane management method, applicable to a data storage device, the data storage device comprising a non-volatile (NV) memory, the NV memory comprising a plurality of NV memory elements, the plurality of NV memory elements comprising a plurality of blocks, the unbalanced plane management method comprising:
   setting an unbalanced plane number, wherein the unbalanced plane number is less than a maximum plane number, and the maximum plane number represents a summation of numbers of respective planes of the plurality of NV memory elements;
   selecting at least one plane with a plane count calculated by subtracting the unbalanced plane number from the maximum plane number, and recording at least one set of blocks of the at least one plane into a block skip table;
   combining blocks of unselected planes into superblocks according to block numbers as indexes, wherein said superblocks correspond to said block numbers respectively;
   determining whether at least one block number of said block numbers is less than a block threshold in order to generate a determination result, wherein the block threshold is equal to a maximum value of all available block numbers, and the determination result indicates whether said at least one block number of said block numbers is less than the block threshold;
   in response to the determination result indicating that said at least one block number of said block numbers is less than the block threshold, combining other blocks of the unselected planes and blocks recorded in the block skip table into other superblocks according to remaining block numbers of said all available block numbers as indexes; and
   recording a total capacity of all superblocks and the unbalanced plane number to generate a latest record of records of multiple types of storage capacity, for further setting storage capacity configuration of the data storage device, wherein said all superblocks comprise said superblocks.

2. The unbalanced plane management method of claim 1, wherein the block skip table comprises at least one set of block skip indexes; and said at least one set of block skip indexes is an array, the array comprises one or more sub-arrays, and a sub-array count of said one or more sub-arrays of the array is equal to the maximum plane number minus the unbalanced plane number, wherein the size of the array is equal to the total number of said at least one set of blocks.

3. The unbalanced plane management method of claim 1, wherein said remaining block numbers comprise subsequent block numbers of said block numbers, said other blocks of the unselected planes comprise subsequent blocks corresponding to said subsequent block numbers, and said other superblocks comprise subsequent superblocks of said superblocks.

4. The unbalanced plane management method of claim 1, wherein the step of determining whether said at least one block number of said block numbers is less than the block threshold in order to generate the determination result comprises:
   comparing the last block number within a block number sequence formed by said block numbers with the block threshold in order to generate the determination result, wherein said last block number has the maximum value among said block numbers.

5. The unbalanced plane management method of claim 1, wherein the records of said multiple types of storage capacity respectively correspond to multiple possible values of the unbalanced plane number, to allow a user to select a record corresponding to a possible value of said multiple possible values from the records of said multiple types of storage capacity based on demands.

6. A data storage device, comprising:
   a non-volatile (NV) memory, arranged to store information, wherein the NV memory comprises a plurality of NV memory elements, and the plurality of NV memory elements comprises a plurality of blocks; and
   a controller, coupled to the NV memory, the controller arranged to control operations of the data storage device, wherein the controller comprises:
      a processing circuit, arranged to control the controller according to a plurality of host commands from a host device, to allow the host device to access the NV memory via the controller, wherein:
         the controller sets an unbalanced plane number, wherein the unbalanced plane number is less than a maximum plane number representing a summation of numbers of respective planes of the plurality of NV memory elements;
         the controller selects at least one plane with a plane count calculated by subtracting the unbalanced plane number from the maximum plane number, and records at least one set of block of the at least one plane to a block skip table;
         according to block numbers as indexes, the controller combines blocks of unselected planes into superblocks, wherein said superblocks are corresponding to said block numbers respectively;
         the controller determines whether at least one block number of said block numbers is less than a block threshold in order to generate a determination result, wherein the block threshold is equal to the maximum value of all available block numbers, and the determination result indicates whether said at least one block number of said block numbers is less than the block threshold;
         in response to the determination result indicating that said at least one block number of said block numbers is less than the block threshold, the controller combines other blocks of the unselected planes and blocks recorded in the block skip table into other superblocks according to remaining block numbers of said all available block numbers as indexes; and
         the controller records the total capacity of all superblocks and the unbalanced plane number to generate a latest record of records of multiple types of storage capacity, for further setting storage capacity configuration of the data storage device, wherein said all superblocks comprise said superblocks.

7. The data storage device of claim 6, wherein the block skip table comprises at least one set of block skip indexes; and said at least one set of block skip indexes is an array that comprises one or more sub-arrays, and a sub-array count of said one or more sub-arrays of the array is equal to the maximum plane number minus the unbalanced plane number, wherein the size of the array is equal to the total number of said at least one set of blocks.

8. The data storage device of claim 6, wherein said remaining block numbers comprise subsequent block numbers of said block numbers, said other blocks of the unselected planes comprise subsequent blocks corresponding to said subsequent block numbers, and said other superblocks comprise subsequent superblocks of said superblocks.

9. The data storage device of claim 6, wherein the controller compares the last block number in a block number sequence formed by said block numbers with the block threshold in order to generate the determination result, wherein said last block number has the maximum value among said block numbers.

10. The data storage device of claim 6, wherein the records of said multiple types of storage capacity correspond to multiple possible values of the unbalanced plane number respectively, to allow a user to select a record corresponding to a possible value of said multiple possible values from the records of said multiple types of storage capacity based on demands.

11. A controller of a data storage device, the data storage device comprising the controller and a non-volatile (NV) memory, the NV memory comprising a plurality of NV memory elements, the plurality of NV memory elements comprising a plurality of blocks, and the controller comprising:
　　a processing circuit, arranged to control the controller according to a plurality of host commands from a host device, to allow the host device to access the NV memory via the controller, wherein:
　　　the controller sets an unbalanced plane number, wherein the unbalanced plane number is less than a maximum plane number, and the maximum plane number represents a summation of numbers of respective planes of the plurality of NV memory elements;
　　　the controller selects at least one plane with a plane count calculated by subtracting the unbalanced plane number from the maximum plane number, and records at least one set of block of the at least one plane to a block skip table;
　　　according to block numbers as indexes, the controller combines blocks of unselected planes into superblocks, wherein said superblocks are corresponding to said block numbers respectively;
　　　the controller determines whether at least one block number of said block numbers is less than a block threshold in order to generate a determination result, wherein the block threshold is equal to the maximum value of all available block numbers, and the determination result indicates whether said at least one block number of said block numbers is less than the block threshold;
　　　in response to the determination result indicating that said at least one block number of said block numbers is less than the block threshold, the controller combines other blocks of the unselected planes and blocks recorded in the block skip table into other superblocks according to remaining block numbers of said all available block numbers as indexes; and
　　the controller records a total capacity of all superblocks and the unbalanced plane number, to generate a latest record of records of multiple types of storage capacity, for further setting storage capacity configuration of the data storage device, wherein said all superblocks comprise said superblocks.

12. The controller of claim 11, wherein the block skip table comprises at least one set of block skip indexes; and said at least one set of block skip indexes is an array that comprises one or more sub-arrays, and a sub-array count of said one or more sub-arrays of the array is equal to the maximum plane number minus the unbalanced plane number, wherein the size of the array is equal to the total number of said at least one set of blocks.

13. The controller of claim 11, wherein said remaining block numbers comprise subsequent block numbers of said block numbers, said other blocks of the unselected planes comprise subsequent blocks corresponding to said subsequent block numbers, and said other superblocks comprise subsequent superblocks of said superblocks.

14. The controller of claim 11, wherein the controller compares the last block number in a block number sequence formed by said block numbers with the block threshold in order to generate the determination result, wherein said last block number is the maximum value of said block numbers.

15. The controller of claim 11, wherein the records of said multiple types of storage capacity correspond to multiple possible values of the unbalanced plane number respectively, to allow a user to select a record corresponding to a possible value of said multiple possible values from the records of said multiple types of storage capacity based on demands.

* * * * *